United States Patent
Rose et al.

(10) Patent No.: US 6,636,030 B1
(45) Date of Patent: Oct. 21, 2003

(54) REVENUE GRADE METER WITH HIGH-SPEED TRANSIENT DETECTION

(75) Inventors: Emery S. Rose, Astoria, NY (US); Erran Kagan, Great Neck, NY (US); Tibor Banhegyesi, Baldwin Harbor, NY (US); Frederick B. Slota, Coram, NY (US)

(73) Assignee: Electro Industries/Gauge Technologies, Westbury, NY (US)

( * ) Notice: Subject to any disclaimer, the term of this patent is extended or adjusted under 35 U.S.C. 154(b) by 2 days.

(21) Appl. No.: 10/099,041

(22) Filed: Mar. 15, 2002

Related U.S. Application Data

(60) Provisional application No. 60/279,429, filed on Mar. 28, 2001.

(51) Int. Cl.$^7$ .............................. G01R 7/00; G01R 11/32
(52) U.S. Cl. ................................ 324/142; 324/140 R
(58) Field of Search ............................ 324/74, 103 R, 324/103 P, 140 R, 141–142, 140 D, 158.1

(56) References Cited

U.S. PATENT DOCUMENTS 4,215,697 A * 8/1980 Demetrescu ................ 600/544
4,255,707 A * 3/1981 Miller ......................... 324/142
6,483,291 B1 * 11/2002 Bhateja et al. ............... 324/142

* cited by examiner

*Primary Examiner*—Kamand Cuneo
*Assistant Examiner*—Minh N. Tang
(74) *Attorney, Agent, or Firm*—Dilworth & Barrese, LLP

(57) ABSTRACT

A revenue grade power meter capable of detecting and recording high-speed power quality events, and method of operation. The power meter comprises a power metering device for monitoring power metering parameters of power consumed by a user or produced by a producer for metering purposes at a first scanning rate; a plurality of high-speed peak detectors for detecting high-speed quality events of the power consumed by the user or provided by the provider at a second scanning rate, the second scanning rate being faster than the first scanning rate; a wave analysis component for comparing the detected high-speed quality events to a predetermined threshold; and a multiplexor for combining the stored detected high-speed quality events in time synchronization with the monitored power metering parameters to display the power metering parameters and the detected high-speed quality events in a single waveform.

14 Claims, 5 Drawing Sheets

REVENUE GRADE METER WITH HIGH-SPEED TRANSIENT DETECTION

PRIORITY

This application claims priority to a provisional application entitled "Revenue Grade Meter With High-Speed Transient Detector" filed in the United States Patent and Trademark Office on Mar. 28, 2001 and assigned Ser. No. 60/279,429, the contents of which are hereby incorporated by reference.

BACKGROUND OF THE INVENTION

1. Field of the Invention

The present invention relates generally to transient signal detection, and in particular, to a High-Speed Transient Recorder and Power Quality Analyzer in a Revenue Grade Power Meter. The purpose of the unit is to record high-speed power quality events such as spikes and transients with a scan rate of 5 KHz to 20 MHz or higher. This allows a monitor, such as a power company, to examine the high-speed events affecting the quality of the power being provided by the power company to an end user (e.g., a utility's customer).

2. Background of the Invention

Conventionally, high-speed power quality events such as spikes and transients were ascertained by a piece of equipment separate from the power meter. This piece of portable equipment is high in cost and is usually brought to the site to monitor power quality after the customer has complained about power quality problems. Then, in order to detect the spikes and transients, this piece of portable monitoring equipment must be used until the power problem occurs yet another time. As a result, correcting any problems that may lead to these high-speed power quality events may take a very long time.

FIG. 1 is a graphical illustration of metered power consumed by a user or provided by a provider at a scanning rate known in the art for the purposes of revenue calculation, e.g. any rate greater than 120 Hz, but usually between 2 KHz and 10 KHz, as performed by a conventional power meter. The graph of the sinusoidal wave is determined by taking a power sample at every $t_n$, determined according to the sampling rate. The common scanning rate that provides a power sample at every $t_n$, while suitable for metering power consumption by a user for the purposes of revenue calculations, is not capable of determining when high-speed power quality events occur. High-speed power quality events such as transients and spikes occur at a rate much faster than the common scanning rate used for power metering. Therefore, unless the high-speed power quality event happens to occur at the exact time the sample is being taken ($t_n$), it will go undetected. This concept will be explained further with reference to FIG. 1 and FIGS. 2A–2D.

As stated above, FIG. 1 is a graph illustrating power metering for the purposes of revenue calculations at a rate where a sample is taken at every interval $t_n$. However, no samples are being taken in the time intervals labeled A, B, C, and D, as these time periods fall between the samples taken at $t_n$. FIGS. 2A–2D are graphical representations of the high-speed power quality events that might occur at times A, B, C, and D, respectively, and that go undetected due to the power meter's slow sampling rate.

Therefore, a need exists for a revenue grade power meter that performs the conventional task of monitoring power and also has the ability to capture high-speed power quality events when they first occur in order to more efficiently monitor and control power usage and efficiency.

SUMMARY OF THE INVENTION

It is, therefore, an object of the present invention to provide a system incorporating high-speed electrical monitoring along with revenue metering functions in an electric meter provided to a customer used for billing.

It is another object of the present invention to provide a system for measuring and recording high-speed electrical events monitored in the meter provided to the customer.

It is yet another object of the present invention to record waveforms of the high-speed electrical events monitored in the meter provided to the customer.

In order to achieve the above and other objects, a preferred embodiment of a revenue grade power meter capable of detecting high-speed power quality events is provided. Other than comprising components found in a conventional revenue grade power meter, the power meter further comprises a plurality of digital high-speed peak detectors for detecting high-speed quality events of the power consumed by the user at a high-speed scanning rate, the high-speed scanning rate being faster than a conventional scanning rate used in a conventional power meter; a wave analysis component for comparing the detected high-speed quality events to a predetermined threshold, storing the detected high-speed quality events in time synchronization with the monitored consumption of power if the high-speed quality events detected are above the predetermined threshold, and disregarding the detected high-speed quality events if the detected high-speed quality events are below the predetermined threshold; a multiplexor for combining the stored detected high-speed quality events in time synchronization with the monitored consumption of power to display the monitored consumption of power and the detected high-speed quality events in a single waveform representation; and the memory for storing the predetermined threshold, the monitored consumption of power, the detected high-speed quality events, and the single waveform representation, to be displayed for the user.

The method of operation for the revenue grade power meter capable of detecting high-speed power quality events of the preferred embodiment comprises monitoring and recording consumption of power by a user for metering purposes at a first scanning rate; detecting and recording high-speed quality events of the power consumed by the user at a second scanning rate, the second scanning rate being faster than the first scanning rate; and combining both recorded results to display the power monitoring result and the detected high-speed quality events in a single waveform representation.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

The present invention is directed towards a revenue grade power meter that is further equipped to detect high-speed power quality events such as transients and spikes. These high-speed power quality events are then stored in a memory for analysis, and revenue calculation if necessary.

Figure 5:
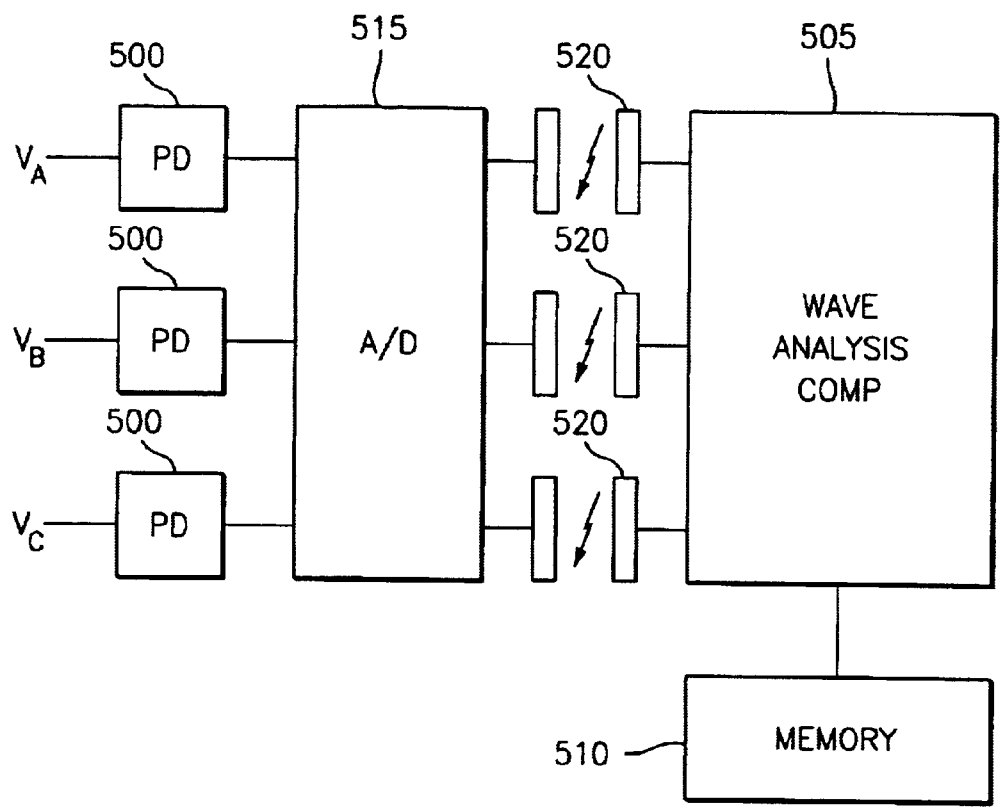
FIG. 5 is block diagram illustrating the main components of a preferred embodiment of the present invention.

A preferred embodiment of a revenue grade power meter capable of detecting high-speed power quality events is illustrated in FIG. 5. Aside from comprising the components conventionally provided in a revenue grade power meter, enabling the conventional meter to monitor various power metering parameters such as voltage, current, frequency, W, VAR, VA, PF, etc. (not shown or described as they are known in the art and would create unnecessary detail), the preferred embodiment comprises at least one high-pass filter (not shown), high-speed peak detectors 500, which may be either analog peak detectors or very fast sampling digital peak detectors for detecting peaks in the metered power, Analog/Digital Converters 515 for converting detections from the analog peak detectors to a digital signal (not necessary if using very fast sampling digital peak detectors), electrical isolators 520 (for example, opto-electrical isolators may be used), a Wave Analysis Component (WAC) 505 for analyzing any high-speed power quality event, and a memory 510 for storing the metered power, including any high-speed power quality events.

Figure 6:
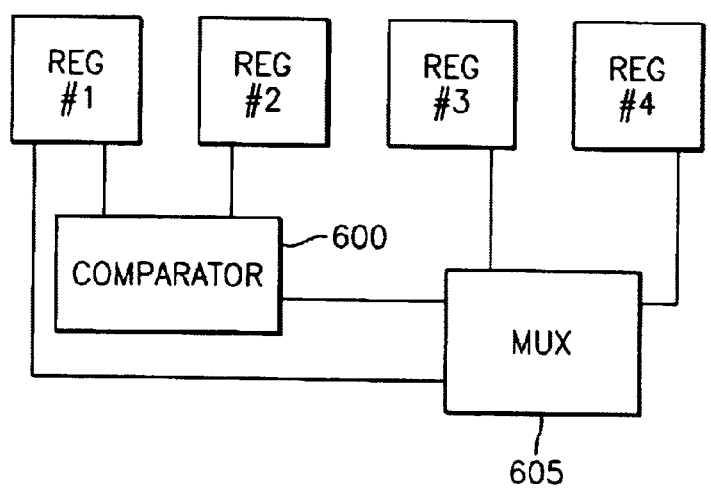
FIG. 6 is a block diagram illustrating the structure of the wave analysis component of the preferred embodiment of the present invention.

FIG. 6 is a block diagram illustrating the structure of the Wave Analysis Component (WAC) 505 of the preferred embodiment illustrated in FIG. 5. For illustrative purposes, the WAC 505 comprises four registers, Registers 1–4, for storing power samples and user defined limits, a comparator 600 for comparing the values of the samples and limits stored in the Registers 1–4, and a multiplexor (MUX) 605 for controlling the operation of the WAC 505.

The components illustrated in FIGS. 5 and 6 will be described in more detail hereinbelow in conjunction with FIG. 7.

Figure 1:
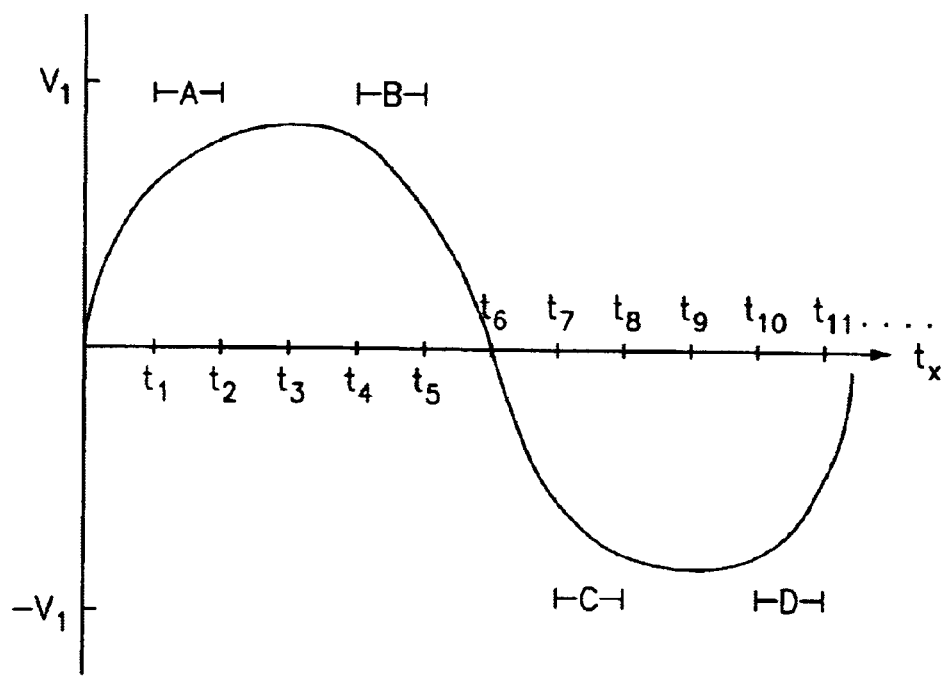
FIG. 1 is a graph illustrating consumption of power by a user for metering purposes at a first scanning rate.
Figure 2A:
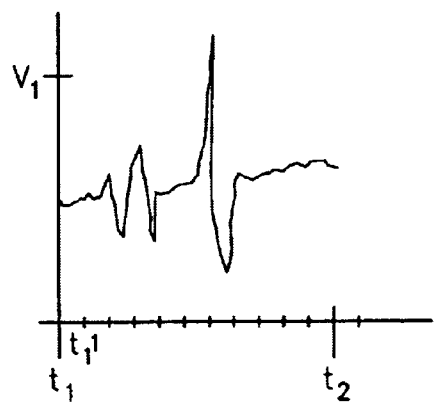
FIGS. 2A–2D are graphs illustrating high-speed quality events of the power consumed by the user at a second scanning rate, the second scanning rate being faster than the first scanning rate.
Figure 2B:
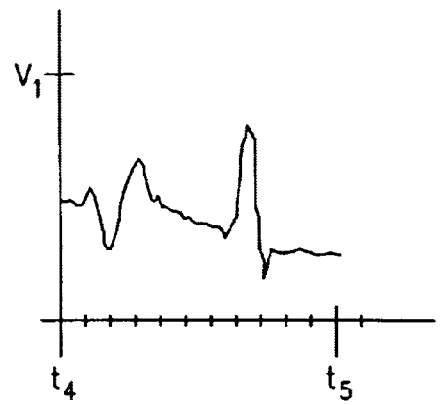
Figure 2C:
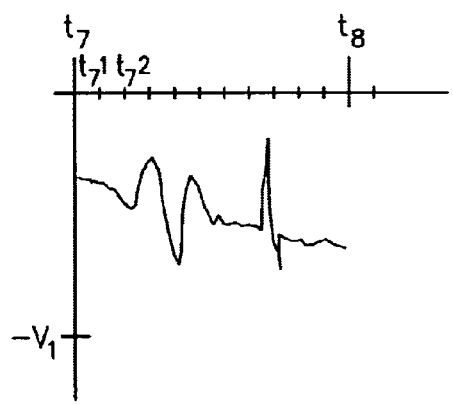
Figure 2D:
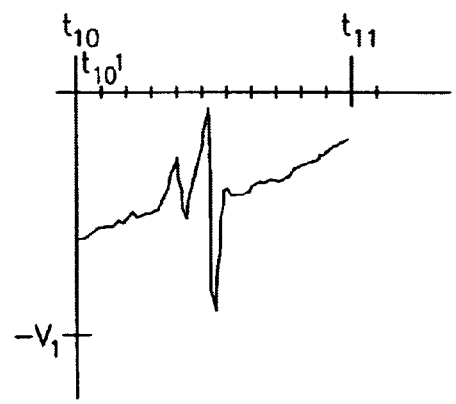
Figure 3:
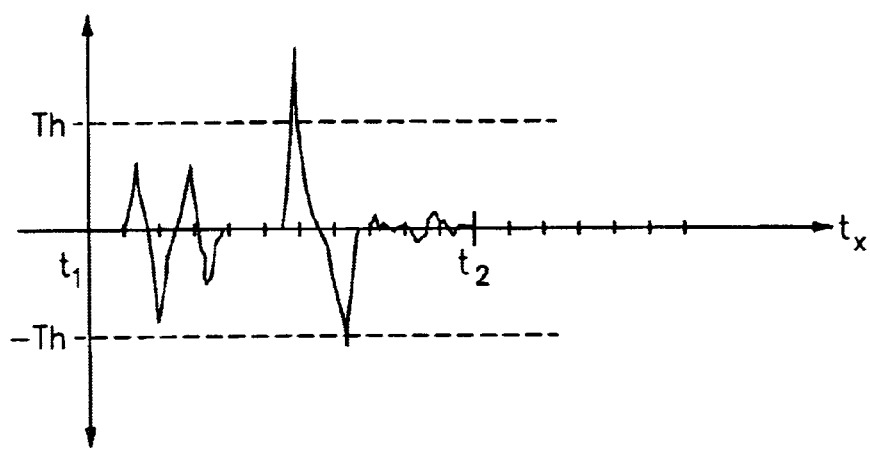
FIG. 3 is a graph of the high-speed quality events after being filtered.
Figure 7:
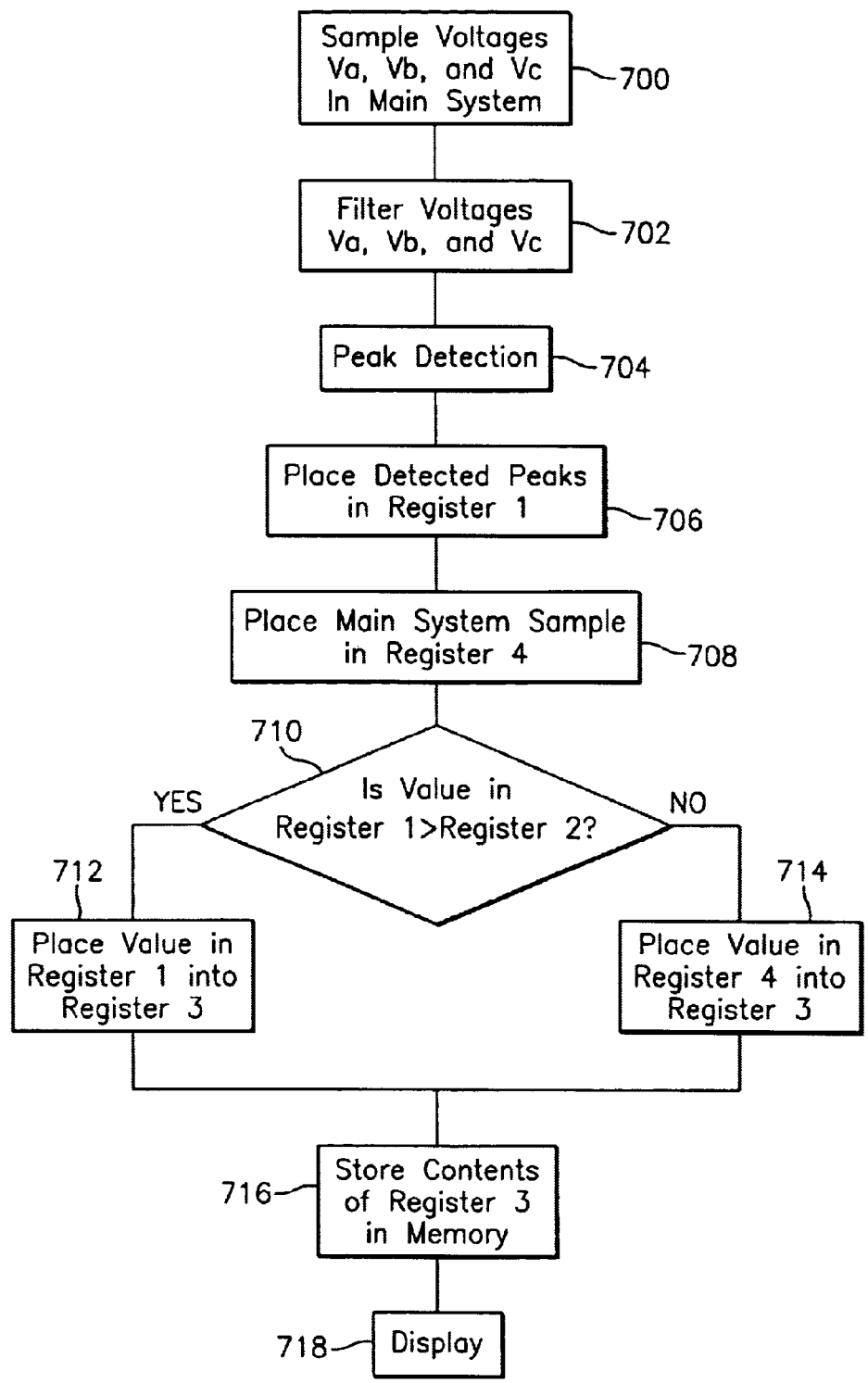
FIG. 7 is flow chart illustrating a procedure for incorporating high-speed electrical monitoring along with revenue metering functions in an electric meter provided to a customer used for billing according to a preferred embodiment of the present invention.

FIG. 7 is a flowchart illustrating a method of operation for the preferred embodiment illustrated in FIG. 5. In step 700, three voltages Va, Vb, and Vc, which correspond to three voltage-in lines of a 3-phase system, are sampled by the main sampling system that conventionally meters the power for revenue calculations at $t_1$, as illustrated in the graph in FIG. 1. In step 702, the three voltages Va, Vb, and Vc, as illustrated in FIG. 5, which are to be sampled in parallel with the main system at a sampling rate much faster than that required for the main sampling system, are filtered by a high-pass filter to distinguish a rapidly rising transient voltage (high dV/dT) or current (dI/dT). A graphical representation of the voltage Va after being passed through the high-pass filter is illustrated in FIG. 3.

After being filtered in step 702, the filtered voltages Va, Vb, and Vc are sent to the peak detectors 500 in step 704. In step 704, the filtered voltages Va, Vb, and Vc are sampled by the peak detectors at rate much higher than the rate used by the main system for revenue calculations. This faster rate is illustrated in FIGS. 2A–2D, wherein a sample is taken at every try. For example, referring to FIG. 2A, corresponding to the time period A of FIG. 1 (the period between $t_1$, and $t_2$), the high-speed peak detectors 500 capture 10 samples; $t_1 1$–$t_1 10$, before the main system takes its sample at $t_2$. The peaks captured at the fast sampling rates are then sent to the WAC and placed in Register 1 in step 706. In step 708, the samples taken at $t_1$ for each voltage-in line by the main system are placed in the WAC, specifically, in Register 4, as illustrated in FIGS. 5 and 6.

If the peak detectors 500 are high-speed analog peak detectors, then an analog to digital conversion must be performed by the Analog/Digital Converters 515 before the captured peaks from the first sampling rate are sent to the WAC and placed in Register 1 in step 706.

Once the values captured by the peak detectors 500 are placed in Register 1, in step 710, the comparator 600 compares the values in Register 1 to a predetermined threshold value stored in Register 2. The predetermined threshold value in Register 2 can either be determined when the meter is constructed or can be set by the monitor of the meter depending on how accurately the monitor and the user wish to monitor the high-speed power quality events. FIG. 3 illustrates a filtered signal and illustrates the predetermined threshold (Th) in relation to the detected peaks. If in step 710 the detected peak values stored in Register 1 are above the predetermined threshold (Th) in Register 2, then in step 712, the values in Register 1 are placed in Register 3. If in step 710 it is determined that the values in Register 1 are below the predetermined threshold (Th), then in step 714, the values in Register 1 are disregarded and the value stored in Register 4, the normal sample taken at $t_1$, is placed in Register 3. The samples stored in Register 3, along with the time at which the samples were taken, are then stored in the memory 510 in step 716. The sample taken at $t_1$ remains in Register 4 until time $t_2$ when a new sample is placed in Register 4 to be used with high-speed samples at $t_2 y$.

After all the samples taken by both systems are stored in memory 510, the user can display the result of the monitoring in step 718. A display may be included in the power meter itself or may comprise a display screen such as a PC, PDA, or other electronic device, that has the ability to retrieve the information from the memory 510. Some possible memory retrieval options are wirelessly sending the information, sending the information via telephone lines, or via the Internet. When using these alternative displays, the power meter includes the requisite communication components.

Figure 4:
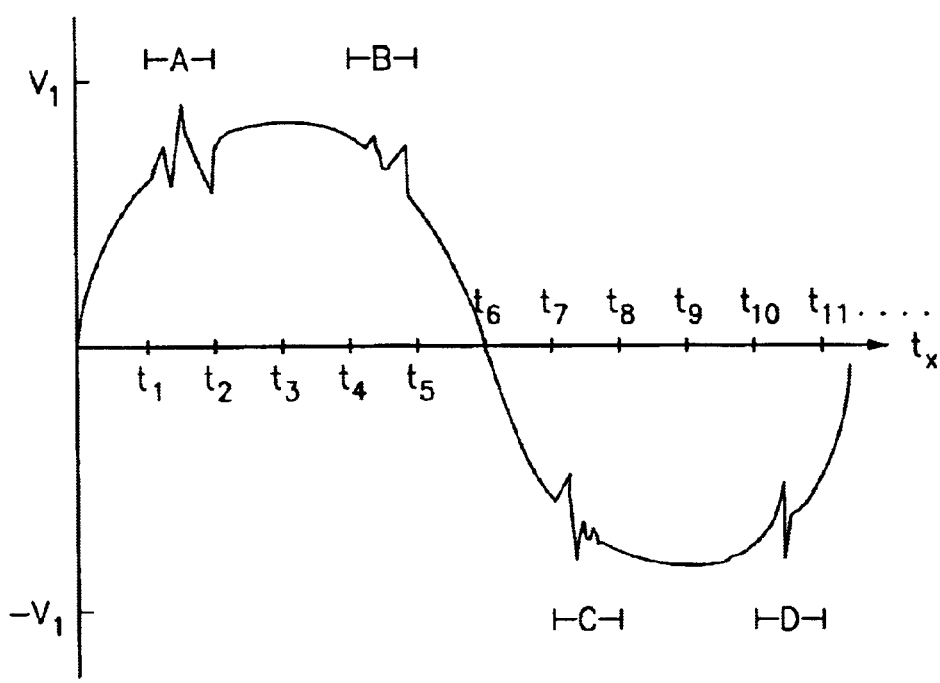
FIG. 4 illustrates the combined result of the consumption of power by a user for metering purposes at the first scanning rate and the high-speed power quality events at the second scanning rate.

FIG. 4 illustrates the combined result of the consumption of power by a user for metering purposes at a first scanning rate and the high-speed power quality events into a single wave form, better illustrating the actual power events as they occurred. As illustrated in FIG. 4, the high-speed power quality events above the threshold are time synchronized by the MUX 605, with the power metered in FIG. 1, resulting in a detailed graph of the actual power provided to the user.

To summarize, the present invention provides a revenue grade power meter capable of detecting high-speed power quality events. The meter performs conventional power metering while also using high-speed peak detectors to capture high-speed power quality events, and then combines the two results to give a more accurate representation of a users power consumption. The present invention is also more efficient in that the high-speed power quality events are detected the first time they occur and not after separate equipment is brought in to monitor the power. This allows the monitor to examine the high-speed events affecting the quality of the power being provided by the power company to an end user.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for providing high-speed transient detection and power quality analysis in a revenue grade power meter, comprising the steps of:
   - monitoring and recording power metering parameters of power consumed by a user or produced by a provider for metering purposes at a first scanning rate;
   - detecting and recording high-speed quality events of the power consumed by the user or provided by the provider at a second scanning rate, the second scanning rate being faster than the first scanning rate; and
   - combining both recorded results to display the power monitoring result and the detected high-speed quality events in a single waveform representation.

2. The method of claim 1, further comprising filtering the high-speed quality events from the power monitoring result before detecting the high-speed quality events.

3. The method of claim 2, further comprising saving the single waveform representation in a memory for viewing by a monitor or the user.

4. The method of claim 1, wherein the step of detecting high-speed quality events of the power consumed by the user or produced by the producer at the second scanning rate, comprises:
   - comparing a transient event detected when detecting high-speed quality events of the power consumed by the user or produced by the provider at the second scanning rate to a predetermined threshold;
   - storing the transient event in time synchronization with the monitored power metering parameters if the transient detected is above the predetermined threshold; and
   - disregarding the transient event if the transient detected is below the predetermined threshold.

5. The method of claim 4, wherein the predetermined threshold is determined by either one of the monitor or the user.

6. The method of claim 4, wherein the step of recording the power metering parameters and the step of recording the high-speed quality events of the power consumed by the user or provided by the provider comprises saving waveforms of the power monitoring results and the detected high-speed-speed quality events into a temporary memory.

7. The method of claim 1, wherein the first scanning rate is at least 120 Hz.

8. The method of claim 1, wherein the second scanning rate is at least 5 KHz.

9. A system for providing high-speed transient detection and power quality analysis in a revenue grade power meter, comprising:
   - a power metering device for monitoring power metering parameters of power consumed by a user or provided by a provider for metering purposes at a first scanning rate;
   - a plurality of digital high-speed peak detectors for detecting high-speed quality events of the power consumed by the user or provided by the provider at a second scanning rate, the second scanning rate being faster than the first scanning rate;
   - a wave analysis component for comparing the detected high-speed quality events to a predetermined threshold, storing the detected high-speed quality events in time synchronization with the monitored power metering parameters if the high-speed quality events detected are above the predetermined threshold in a memory, and disregarding the detected high-speed quality events if the detected high-speed quality events are below the predetermined threshold;
   - the memory stores the predetermined threshold, the monitored power metering parameters, the detected high-speed quality events, and a single waveform representation, to be displayed for the user;
   - a multiplexor for combining the stored detected high-speed quality events in time synchronization with the monitored power metering parameters to display the power metering parameters and the detected high-speed quality events in the single waveform representation; and
   - a display unit for displaying the contents of the memory.

10. The system of claim 9, further comprising a high pass filter for filtering the high-speed quality events from the monitored consumption of power before being detected by the digital high-speed peak detectors.

11. The system of claim 9, wherein the display is separate unit capable of retrieving the contents of the memory.

12. A system for providing high-speed transient detection and power quality analysis in a revenue grade power meter, comprising:
   - a power metering device for monitoring power metering parameters of power consumed by a user or provided by a provider for metering purposes at a first scanning rate;
   - a plurality of analog high-speed peak detectors for detecting high-speed quality events of the power consumed by the user or provided by a provider at a second scanning rate, the second scanning rate being faster than the first scanning rate;
   - an analog/digital converter for converting analog signals into digital signals to perform calculations and comparisons;
   - a wave analysis component for comparing the detected high-speed quality events to a predetermined threshold, storing the detected high-speed quality events in time synchronization with the monitored power metering parameters if the high-speed quality events detected are above the predetermined threshold in a memory, and disregarding the detected high-speed quality events if the detected high-speed quality events are below the predetermined threshold;
   - the memory stores the predetermined threshold, the monitored power metering parameters, the detected high-speed quality events, and a single waveform representation, to be displayed for the user;

a multiplexor for combining the stored detected high-speed quality events in time synchronization with the monitored power metering parameters to display the power metering parameters and the detected high-speed quality events in the single waveform representation; and a display unit for displaying the contents of the memory.

13. The system of claim 12, further comprising a high pass filter for filtering the high-speed quality events from the monitored consumption of power before being detected by the analog high-speed peak detectors.

14. The system of claim 12, wherein the display is a separate unit capable of retrieving the contents of the memory.

* * * * *